(12) United States Patent
Hau (10) Patent No.: US 9,543,925 B2
(45) Date of Patent: Jan. 10, 2017

(54) VOLTAGE CONTROLLED IMPEDANCE SYNTHESIZER

(71) Applicant: TECHNO RESOURCES HK, Hong Kong (CN)

(72) Inventor: King Kuen Hau, Hong Kong (CN)

( * ) Notice: Subject to any disclaimer, the term of this patent is extended or adjusted under 35 U.S.C. 154(b) by 0 days.

(21) Appl. No.: 14/423,712

(22) PCT Filed: Sep. 3, 2013

(86) PCT No.: PCT/IB2013/058250
§ 371 (c)(1),
(2) Date: Feb. 25, 2015

(87) PCT Pub. No.: WO2014/033694
PCT Pub. Date: Mar. 6, 2014

(65) Prior Publication Data
US 2015/0229294 A1    Aug. 13, 2015

Related U.S. Application Data

(60) Provisional application No. 61/696,238, filed on Sep. 3, 2012, provisional application No. 61/734,948, filed on Dec. 7, 2012.

(51) Int. Cl.
| | |
|---|---|
| *H01P 1/22* | (2006.01) |
| *H03H 11/28* | (2006.01) |
| *G06J 1/00* | (2006.01) |
| *H03H 7/38* | (2006.01) |
| *H03H 5/02* | (2006.01) |

(52) U.S. Cl.
CPC .............. *H03H 11/28* (2013.01); *G06J 1/00* (2013.01); *H03H 7/38* (2013.01); *H03H 5/02* (2013.01); *H03H 2210/036* (2013.01)

(58) Field of Classification Search
CPC .............................. H05B 33/083; H03H 11/28
USPC ......... 327/308, 306; 333/81 R; 315/291, 294, 315/123, 122
See application file for complete search history.

(56) References Cited

U.S. PATENT DOCUMENTS

| | | | | |
|---|---|---|---|---|
| 7,830,095 | B2 * | 11/2010 | Erhardt .................... | H01G 4/40 315/209 R |
| 9,100,046 | B2 * | 8/2015 | Granger-Jones ...... | H03M 1/682 |

\* cited by examiner

*Primary Examiner* — Dinh T Le (57) ABSTRACT

A voltage controlled impedance synthesizer providing stepwise variable impedance values according to a prescribed function of the control voltage, said synthesizer comprises of one or more two-terminal impedance modules connected in series, in each impedance module one or more essentially identical two-terminal impedance elements connected in series, a corresponding number of switches to short out by selection none to all of the impedance elements in the impedance module, and said switches being controlled by the control voltage through analog-to-digital conversion and digital processing means. The values of the impedance elements between the impedance modules in ratios being uniquely defined according to the numbers of impedance elements in the impedance modules, the voltage controlled impedance synthesizer is controlled to provide monotonic and stepwise variable impedance values. Further, through the use of the voltage controlled impedance synthesizer, other electrical parameters such as current and power can be controlled according to any prescribed functions.

9 Claims, 6 Drawing Sheets

VOLTAGE CONTROLLED IMPEDANCE SYNTHESIZER

BACKGROUND OF THE INVENTION

Field of Invention

The present invention relates generally to apparatus and methods for electrical impedance control and synthesis, and more particularly to impedance control and synthesis by voltage.

Description of the Related Art

Electrical impedance is the measure of the opposition that a circuit presents to the passage of a current when a voltage is applied. In the prior arts, impedance is simulated using active analogue circuits in impedance synthesizers or emulators for a wide range of prescribed resistance, capacitance, and inductance values. As a major application, these impedance values are deployed as reference standards for calibrating electronic test and measurement instruments. During a calibration process, each of the reference components is individually measured by the instrument under calibration and the measured value is compared with the known value from which error of the instrument reading is determined. In general, different instruments may require different reference components. An impedance synthesizer can therefore provide conveniently a myriad of impedance values required for the calibration of many different instruments.

By the way the prior art impedance synthesizer is implemented there are however limitations in the power or voltage handling capabilities for the simulated components. Taking the following patents for example:

U.S. Pat. Nos. 4,963,845, 5,485,115, 5,585,741, 6,351,137, 6,369,650, 6,646,463, 7,808,314 and CN201141879, by which operational amplifiers, digital-to-analog converters, analog-to-digital converters and other linear active circuit elements are deployed in the impedance synthesizer circuits. The relatively low voltage and power handling capabilities of these semiconductor circuit elements have imposed limitations on the power or voltage handling capacities of the impedance synthesized thereof. This is fine for calibrating electronic test and measurement instruments as the impedance values at low signal levels are normally of interest in these applications.

In a different area of application the present invention is exploring however, electrical impedance synthesis techniques can be deployed to control electrical parameters other than instrument calibrations. For example, by varying the impedance of a load synthesized under a supply voltage, a controlled load current is formed. As another example, by controlling the impedance of a load synthesized by an impedance synthesizer and powering the same under at a supply voltage, the amount of power delivered to the load can be controlled. Further, through the control of impedance, and hence the control of current or power, other physical parameters such as temperature, luminosity, pressure, force, speed, etc. can be controlled. The idea, which appears still new to the academic and engineering communities, will be explained in the following specifications of the present invention.

For these applications where high power or high current is required, it would be very difficult and expensive if not impossible to deploy high power operational amplifiers and other active analog devices required for impedance synthesis in the traditional way, even if power efficiency is not taken into consideration.

SUMMARY OF THE INVENTION

Accordingly, the present invention intends to explore a new area of electronic power control through the creation of a novel voltage controlled impedance synthesizer with the following features:

a) High power efficiency through selective connection of component impedance elements.

b) Minimum number of switches required for a targeted accuracy.

c) The quality factor of the impedance synthesized remains unchanged at the frequency of application.

d) The degree of linearity of the impedance synthesized remains unchanged.

e) The impedance value is synthesized according to a prescribed function of the control voltage.

f) The impedance value synthesized bears a monotonic relationship with the prescribed function.

g) The synthesized impedance bears a stepwise but linear relationship with the prescribed function of the control voltage.

h) The control method is simple and straight forward.

According to an embodiment of the present invention, a voltage controlled impedance synthesizer provides stepwise variable impedance values according to a prescribed function of the control voltage, said synthesizer comprises of one or more two-terminal impedance modules connected in series, in each impedance module one or more essentially identical two-terminal impedance elements connected in series, a corresponding number of switches to short out by selection none to all of the impedance elements in the impedance module, and said switches being controlled by the control voltage through analog-to-digital conversion and digital processing means. The values of the impedance elements between the impedance modules in ratios being uniquely defined according to the numbers of impedance elements in the impedance modules, the voltage controlled impedance synthesizer is controlled to provide monotonic and stepwise variable impedance values. Further, through the use of the voltage controlled impedance synthesizer, other electrical parameters such as current and power can be controlled according to any prescribed functions.

Furthermore, by the duality property of electrical circuits, the present invention can be applied also to the synthesis of electrical admittance, as will be elaborated in the following description.

Figure 1:
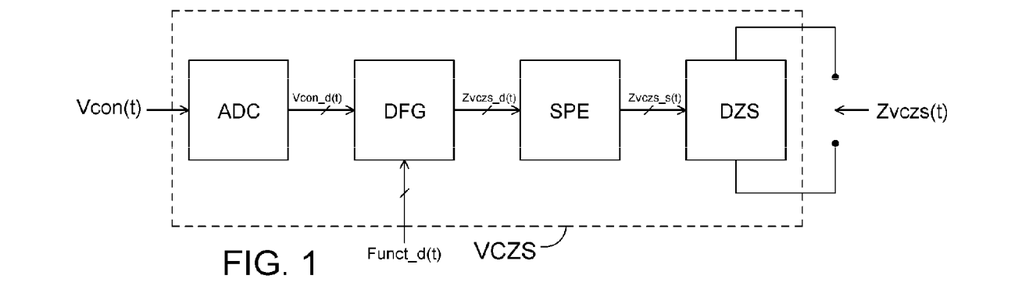
FIG. 1 is a block diagram showing the operation principle of a Voltage Controlled Impedance Synthesizer VCZS as an embodiment of the present invention.

The operation principle of the Voltage Controlled Impedance Synthesizer VCZS as an embodiment of the present invention is illustrated by the block diagram of FIG. 1. As shown, a controlling voltage Vcon(t) is converted to its digital equivalent by an analog-to-digital converter ADC, then processed by the Digital Function Generator DFG, with a function input Func_d(t) as required by the design. The output of the Digital Function Generator DFG, Zvczs_d(t), is further processed by the Switch Pattern Encoder SPE to transform the output of the Digital Function Generator DFG, Zvczs_d(t), to a switch state pattern for the Digital Impedance Synthesizer DZS by which impedance values of Zvczs(t) is generated according to the output of the Digital Function Generator DFG, Zvczs_d(t), which is controlled by the controlling voltage Vcon(t). Digital Function Generator DFG and Switch Pattern Encoder SPE can be implemented by any suitable digital processing devices, such as microprocessors with suitable software programmes.

Figure 2:
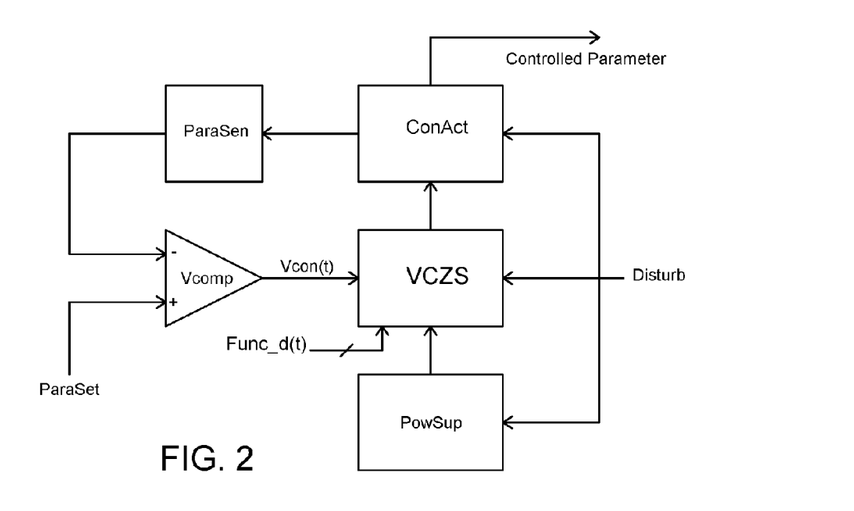
FIG. 2 is a block diagram showing a feedback control system deploying a Voltage Controlled Impedance Synthesizer VCZS as an embodiment of the present invention.

FIG. 2 is a block diagram showing a feedback control system deploying a Voltage Controlled Impedance Synthesizer VCZS as an embodiment of the present invention. As in any control system, the parameter(s) of control is first defined. The parameter can be any electrical or other physical quantities intended to be controlled, such as electrical voltage, electrical current, electrical power, or physical quantities that can be controlled through electrical means, such as temperature, luminosity, pressure, force, speed, etc., etc. As shown in FIG. 2, the Controlled Parameter, the physical quantity be controlled, is measured by the ParaSen, a sensing device for detecting or measuring the physical quantity such as the voltage across the load, such as the current through the load, such as the power dissipated by the load, or such as the temperature being controlled via the heating effect of the load, etc. The measured value is converted into a signal, suitably conditioned by general electronic means to represent the measured value as its peak, average, RMS (root-mean-square), instantaneous or any other forms of values, and compared to the ParaSet which defines the desired value of the physical quantity to be achieved from the system. The result of comparison, the voltage Vcon(t), representing the departure of the controlled parameter from the parameter set, ParaSet by a predefined amount, will provide a control signal for turning on and turning off each of the switches within the Voltage Controlled Impedance Synthesizer VCZS so as to control the impedance of VCZS as the load in a way to minimize the departure of the controlled parameter from the ParaSet, despite of any variations in the power supply or any variation in the load or any other external disturbances, designated Disturb in the diagram. Consequently the parameter is regulated to a value close to the parameter set, ParaSet, as intended.

The area of application of a Voltage Controlled Impedance Synthesizer VCZS as deployed in an exemplary feedback control system and as illustrated by the block diagram of FIG. 2 covers any physical parameters to be controlled according to the desired ParaSet. Further, the ParaSet is in general a function of time and can therefore be expressed as the average, the peak, the RMS (root-mean-square), the instantaneous, or any other forms of values of the desired parameter to be achieved by the system as intended. Further still, the parameter to be achieved, so is the ParaSet, can be a function of time relative to the cycle of a periodic signal, such as that of the mains supply cycle, at 50 Hz or 60 Hz as the common mains supply frequency.

It is therefore desirable for the above application to provide an apparatus or a method for synthesizing impedance values through circuit switching of a combination of component impedance elements, to vary in a series of steps accurately and speedily within a predetermined control range. It is also desirable that any variation of the impedance synthesized is monotonic, i.e. the controlled impedance always increases or remains constant as the value representing the controlling digital input increases, while the controlled impedance always decreases or remains constant as the value representing the controlling digital input decreases. Monotonicity is required as an essential characteristic for stability for a control system. Further it is also desirable to have any variation of the impedance synthesized in steps of equal magnitudes, a feature essential to the fineness of control.

Figure 3A:
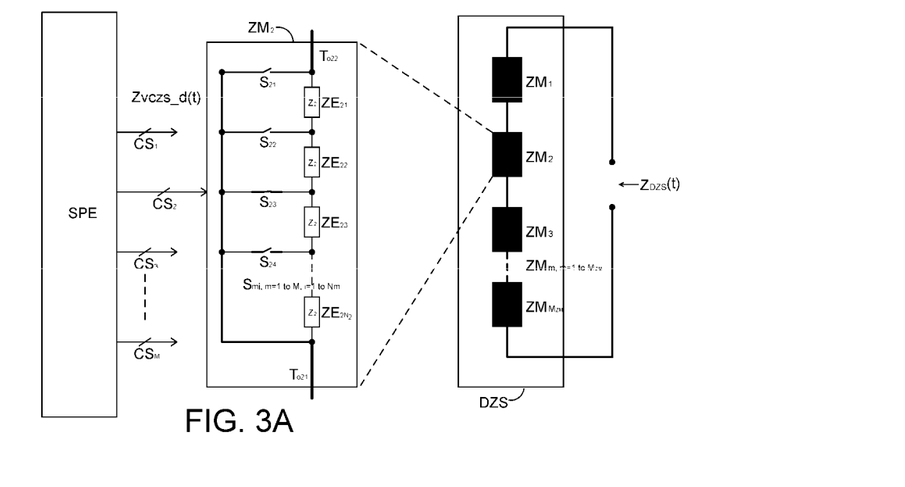
FIG. 3A shows the basic architecture of a Digital Impedance Synthesizer DZS deployed in the Voltage Controlled Impedance Synthesizer VCZS as an embodiment of the present invention.

The digital approach as adopted by various embodiments of the present invention is through switching in and out of "Impedance Elements" by a Digital Impedance Synthesizer, DZS as illustrated by FIG. 3A, which will be explained in depth in the detailed specifications. By the digital approach, the impedance is changed in discrete values by steps. The precision of control is therefore limited by the size of the impedance steps. It is obvious for a prescribed range of impedance control, the precision of control is inversely proportional to the number of impedance levels that can be "stepped" through. It is also obvious that for any fixed number of impedance levels, all impedance steps should be made equal to achieve the highest precision of impedance control.

Over the past decades, many different switching circuit topologies have been invented for other areas of application, such as that for AC voltage regulation. In general, when the number of steps is increased for the purpose of achieving finer control, the number of states of the switches and hence the actual number of switches required will inevitably increase. Since the switches are the key and relatively expensive components of the system, precision of control has often been compromised for lowering down the system cost by limiting the number of switches employed. This is highly undesirable and many different varieties of switching circuit topologies and control methods have been attempted in the past to achieve higher control accuracy while limiting the number of switches employed for circuit simplicity and cost reduction. However these existing designs are in general complicated in overall system structure, and are therefore difficult to be designed and deployed.

Further, as fine steps are achieved with sufficiently large number of switching states, higher control accuracy becomes feasible, bring in a new challenge to the designers. Dependent of the actual circuit design and the precision in circuit implementation, linearity or even monotonicity relationship between the digital control signal and the controlled impedance might be lost as the size of the steps decreases, leading possibly to system instability and/or reduction in control accuracy and thus imposing a very challenging task to the designer.

In fact, there is an issue on the practical limitations affecting the linearity and monotonicity of the Voltage Controlled Impedance Synthesizer VCZS, i.e. the accuracy of the Impedance Elements ZEs. It can be shown that when the Impedance Elements ZEs are not made sufficiently accurate and matched with each other well in right ratios, the linearity and monotonicity could not be achieved. Consequently the performance of the Voltage Controlled Impedance Synthesizer VCZS, in terms of control accuracy and system stability, is likely compromised if this aspect in system design is not properly addressed.

Apart from practical limitations of components available, there is no restriction by the present disclosed approach in designing the Voltage Controlled Impedance Synthesizer VCZS in terms of control accuracy, number of switches deployed, the total number and values of impedance elements. The method of control and the associated control circuitry is simple and straight forward, while the practical limitations affecting the linearity and monotonicity will be addressed to have its consequent bad effects removed too.

Additional applications and advantages of the invention will become apparent from the following description and the accompanying drawings. It is understood that changes in the specific structure shown and described may be made without departing from the scope and spirit of the invention.

BRIEF DESCRIPTION OF THE DRAWINGS

With the foregoing in view, as other advantages as will become apparent to those skilled in the art to which this invention relates as this patent specification proceeds, the invention is herein described by reference to the accompanying drawings forming a part hereof, which includes descriptions of some typical preferred embodiments of the principles of the present invention, in which.

DETAILED DESCRIPTION OF THE INVENTION

Glossary:
ADC Analog-to-Digital Converter
DFG Digital Function Generator
SPE Switch Pattern Encoder
Vcon(t) Control Voltage
Vcon_d(t) Control voltage in digital form
ParaSen Sensing device for detecting or measuring a physical quantity
ParaSet The desired value of the physical quantity to be achieved from a system
DZS Digital Impedance Synthesizer
VCZS Voltage Controlled Impedance Synthesizer
Zvczs(t) Impedance synthesized by the Voltage Controlled Impedance Synthesizer
Zvczs_d(t) Impedance intended to be synthesized in digital form
Func_d(t) A function in digital form
Zvers_s(t) Impedance intended to be synthesized expressed as switch patterns
Vcomp Voltage Comparator
PowSup Power Supply
ConAct Control Actuator
Disturb Disturbance noise
ZM Impedance Module
$M_{ZM}$ Total number of ZMs
$T_{om1}$ The output terminal one of the $m^{th}$ Impedance Module $ZM_m$
$T_{om2}$ The output terminal two of the $m^{th}$ Impedance Module $ZM_m$
$ZM_m$ $m^{th}$ ZM, m=1 to $M_{ZM}$
$Z_{mo}$ Nominal maximum impedance of the $m^{th}$ ZM, m=1 to $M_{ZM}$
$\delta Z$ Deviation from the nominal value of Z
ZE Impedance Element
$ZE_{mc}$ $c^{th}$ ZE in $m^{th}$ ZM, c=1 to $N_m$, m=1 to $M_{ZM}$
$N_m$ Number of ZEs in the $m^{th}$ ZM, m=1 to $M_{zm}$
$Z_m$ The nominal impedance of each of the $N_m$ Impedance Elements in the $m^{th}$ ZM, m=1 to $M_{ZM}$, $Z_m=A_m+jB_m$ in general where $A_m$ and $B_m$ are resistive and reactive impedances respectively
$Z_{mc}$ The nominal impedance of the $c^{th}$ ZE in $m^{th}$ ZM, c=1 to $N_m$, m=1 to $M_{ZM}$
$\delta Z_{mc}$ Deviation from the nominal value of $Z_{mc}$
$\delta Z_a$ The largest impedance deviation from the nominal impedance for any of the Impedance Elements ZEs in all Impedance Modules ZMs
$S_{mi}$ The $i^{th}$ switch in the $m^{th}$ Impedance Module $ZM_m$, i=1 to $N_m$
CSs Switch Control Signal
$CS_m$ Control signal for the switches in the $m^{th}$ Impedance Module $ZM_m$
$I_{sense}$ Current sensor
$V_{sense}$ Voltage sensor
f(t) Function of time
$I_{load}$ Load current
PWRset Prescribed power, or Power set as the reference
$I_{led}$ Light Emitting Diode (LED) current
$V_{sup}$ Supply voltage
$V_s$ Scaled down of the Supply voltage $V_{sup}$
$V_I$ Voltage representative of Current
$V_{ac}$ AC voltage supply
$V_{rect}$ Rectified Voltage
DAS Digital Admittance Synthesizer
VCAS Voltage Controlled Admittance Synthesizer
AM Admittance Module
AE Admittance Element The invention will now be described more specifically with reference to the figures. It is to be noted that the following descriptions of preferred embodiments of this invention are prepared herein for purpose of illustration and description only. It is not intended to be exhaustive or to be limited to the exact forms disclosed, since the Voltage Controlled Impedance Synthesizer according to the invention may be advantageously used and modified in various fields.

FIG. 1 is a block diagram showing the operation principle of a Voltage Controlled Impedance Synthesizer VCZS, as an embodiment of the present invention. As shown, the controlling voltage Vcon(t), which is in general varying with time, is converted to its digital equivalent, Vcon_d(t), continuously by the analog-to-digital converter ADC, then processed by digital processing means in the Digital Function Generator DFG which defines the function, in digital form, of the synthesized impedance $Z_{VCZS}(t)$ in accordance with the controlling voltage Vcon(t). The output from the Digital Function Generator DFG, Zvczs_d(t), is further processed by digital processing means in the Switch Pattern Encoder SPE to establish a switch state pattern, as the signal Zvczs_s(t) in digital form, in order to set the switches in the Digital Impedance Synthesizer DZS and hence to generate the impedance values according to the controlling voltage Vcon(t).

Here "digital processing means" refers to any digital devices or apparatus deployed for the necessary digital logic operations.

The Digital Impedance Synthesizer DZS comprises of one or more two-terminal impedance modules connected in series, each impedance module having one or more essentially identical two-terminal impedance elements connected in series, and a corresponding number of switches to short out by selection none to all of the impedance elements in the impedance module. By making the values the impedance elements between the impedance modules in ratios uniquely defined according to the numbers of impedance elements in the impedance modules, and by controlling the said switches through the Switch Pattern Encoder SPE implemented by digital processing means, the digital impedance synthesizer can be controlled to provide monotonic and stepwise variable impedance values according to the controlling voltage Vcon(t). More details of the explanation of the operation principle of the Digital Impedance Synthesizer DZS is following.

FIG. 3A shows the basic architecture of a Digital Impedance Synthesizer DZS deployed in the Voltage Controlled Impedance Synthesizer VCZS as an embodiment of the present invention. As shown, the Digital Impedance Synthesizer DZS contains one or more two-terminal Impedance Modules ZMs connected in series to provide a controlled impedance $Z_{DZS}$, the total number of Impedance Modules ZMs being $M_{ZM}$. Each of the $M_{ZM}$ Impedance Modules ZMs has two output terminals, $T_{om1}$ and $T_{om2}$, for m=1 to $M_{ZM}$, as shown in FIG. 3A with the details of the circuit topology in Impedance Module $ZM_2$ exposed as an illustrative example of a typical Impedance Module ZM. Circuit topology of similar structure is found in every one of the other Impedance Modules ZMs.

Within each of the Impedance Modules ZMs, there are one or more two-terminal Impedance Elements ZEs connected in series, the Impedance Elements ZEs being in galvanic isolation before said connection, the total number of ZEs in the $m^{th}$ Impedance Module ZMs being $N_m$, where m=1 to $M_{ZM}$.

Within each of the Impedance Modules ZMs, all the Impedance Elements ZEs have essentially the same impedance values, even for the impedance elements with non-linear characteristics, such as diodes. In other words, the nominal impedance values of the Impedance Elements ZEs is $Z_{m1}=Z_{m2}=Z_{m3}=\ldots=Z_{mc}$ where c=1 to $N_m$, i.e.

for any of the Impedance Module $ZM_m$. For non-linear impedance elements, the equality still holds as by design the same current level is always passing through every one of all the elements in each Impedance Module ZM. The same value of impedance is designated $Z_m$ as the nominal impedance in the $m^{th}$ Impedance Module ZM.

Within each of the Impedance Modules ZMs, all the Impedance Elements ZEs are connected in series such that each Impedance Element ZE is adding directly to the overall impedance of the Impedance Module ZM. In other words, the largest impedance achievable from the Impedance Module ZM is the direct arithmetic sum of impedances from all the Impedance Elements ZEs within the Impedance Module ZM, i.e. $Z_m \times N_m$ in the $m^{th}$ Impedance Module ZM.

Further, an additional requirement is that the impedance elements in all the impedance modules are of essentially the same quality factor at the frequency of application. In other words, the ratio of reactance to resistance of any impedance element is the same as any other impedance elements. By this, the combined impedance of any number of impedance elements for all impedance modules connected in series can be determined by direct summation of the respective resistance and reactance values respectively.

Within each Impedance Module ZM, such as $ZM_2$ as an example for illustration, for which the number of Impedance Elements ZEs is $N_2$=4. As shown, the switches designated by $S_{21}$, $S_{22}$, $S_{23}$ and $S_{24}$ are connected in parallel with the series of Impedance Elements ZEs such that one terminal of each of all the switches are connected together to one of the two output terminals $T_{o21}$ and $T_{o22}$ of the Impedance Module $ZM_2$, say $T_{o21}$ as shown in FIG. 3A. The other terminals of all switches are connected to the series of Impedance Elements ZEs as follows: $S_{21}$ to $T_{o22}$ which is connected to the first Impedance Element, $ZE_{21}$, $S_{22}$ to the terminal connecting Impedance Elements $ZE_{21}$ and $ZE_{22}$, $S_{23}$ to the terminal connecting Impedance Elements $ZE_{22}$ and $ZE_{23}$, $S_{24}$ to the terminal connecting Impedance Elements $ZE_{23}$ and $ZE_{24}$, i.e. $S_{2i}$ to the terminal connecting the Impedance Elements $ZE_{2(i-1)}$ and $ZE_{2i}$.

Alternatively, the switches $S_{21}$, $S_{22}$, $S_{23}$ and $S_{24}$ can be connected to perform the same function with one terminal of each of all the switches connected together to the output terminal $T_{o22}$ instead (and not to $T_{o21}$!), the other terminals of all switches are connected with $S_{21}$ to $T_{o21}$ which is connected to the fourth Impedance Element $ZE_{24}$, $S_{22}$ to the terminal connecting Impedance Elements $ZE_3$ and $ZE_4$, $S_{23}$ to the teiminal connecting Impedance Elements $ZE_{22}$ and $ZE_{23}$, and $S_{24}$ to the terminal connecting Impedance Elements $ZE_{21}$ and $ZE_{22}$, i.e. $S_{2i}$ to the terminal connecting the Impedance Elements $ZE_{2(N2-i+1)}$ and $ZE_{2(N2-i+2)}$.

Note that a switch is an electrical component that can make and break an electrical circuit, interrupting the current or diverting it from one conductor to another. The switches mentioned herein are therefore not limited to any form or any kind, such as those of mechanical contact switches, relay switches, contactors, semiconductors switches such as MOSFETs, JFETs, IGBTs, BJTs, Thyristors, solid-state-relays, etc.

The property of monotonicity refers to a way how the synthesized impedance of a Digital Impedance Synthesizer DZS follows the controlling digital input, i.e. the controlled impedance always increases or remains constant as the value representing the controlling digital input increases, while the controlled impedance always decreases or remains constant as the value representing the controlling digital input decreases. According to various embodiments of the present invention, for all Impedance Elements ZEs in all Impedance Modules ZMs, i.e. $ZE_{mc}$ for $c^{th}$ ZE in $m^{th}$ ZM, for c=1 to $N_m$, m=1 to $M_{ZM}$, proper weightings are assigned to the various nominal impedance $Z_m$ among the Impedance Modules ZMs. A necessary condition for achieving monotonicity has to be met as follows:

Assigning the lowest weighting to $ZM_1$, then progressively higher weightings for $ZM_2$, $ZM_3$, $ZM_4$, etc., then the conditions for monotonicity are:

the value of Z2 is no lower than the maximum achievable value of ZM1;

the value of Z3 is no lower than the maximum achievable value of ZM2 plus the maximum achievable value of ZM1;

the value of Z4 is no lower than the maximum achievable value of ZM3 plus the maximum achievable value of ZM2 plus the maximum achievable value of ZM1;

and so on.

Further, for linearity relationship between the synthesized impedance of a Digital Impedance Synthesizer DZS and the controlling digital input, i.e. there is yet another condition required to be met according to some embodiments of the present invention:

The ratios of the magnitudes of impedance $Z_m$ of the Impedance Elements ZEs between the Impedance Modules are uniquely defined according to the numbers of Impedance Elements ZEs in the Impedance Modules ZMs with lower weightings compared to that of the Impedance Module under consideration, as defined by the following equation:

$$Z_1:Z_m=1: \Pi(N_i1+1) \text{ where } i=1 \text{ to } m-1, m=1 \text{ to } M_{ZM}.$$

For example, $Z_1:Z_2=1:(N_1+1)$,
$Z_1:Z_3=1:(N_1+1)\times(N_2+1)$,
$Z_1:Z_4=1:(N_1+1)\times(N_2+1)\times(N_3+1)$,
etc.

As an example for illustration, let a Digital Impedance Synthesizer DZS be constructed with three Impedance Modules, $ZM_1$, $ZM_2$ and $ZM_3$:

For $ZM_1$: N1=4
For $ZM_2$: N2=3
For $ZM_3$: N3=5

Let $Z1=10$ ohm, then $Z_1:Z_2=10:Z2=1: (N_1+1)=1:5$, therefore $Z2=50$
$Z_1:Z_3=1:(N_i+1)\times(N_2+1)$, then $10:Z3=1:5\times4=1:20$, therefore $Z3=200$ Thus the Digital Impedance Synthesizer DZS so constructed will have a total of three Impedance Modules each with 4, 3 and 5 Impedance Elements with values each 10, 50 and 200 ohms respectively. Total number of switch states is $(4+1)\times(3+1)\times(5+1)=120$, synthesizing 120 impedance values from 0 to $(10\times4)+(50\times3)+(200\times5)=1190$ ohms in steps of 10 ohms.

It can be verified easily by the above example that when the necessary conditions for linearity are met, conditions for monotonicity are also satisfied.

Figure 3B:
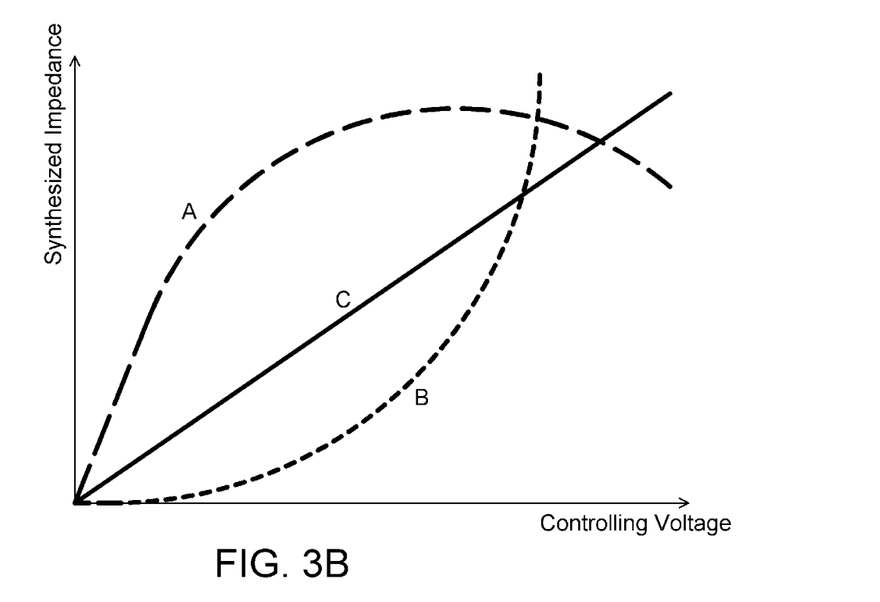
FIG. 3B shows the kinds of possible relationship between the input and output of an impedance synthesizer.

FIG. 3B shows the kinds of possible relationship between the input and output of an impedance synthesizer in terms of monotonicity and linearity: curve A is non-monotonic and non-linear, curve B is monotonic but non-linear, while curve C is linear as well as monotonic.

Figure 3C:
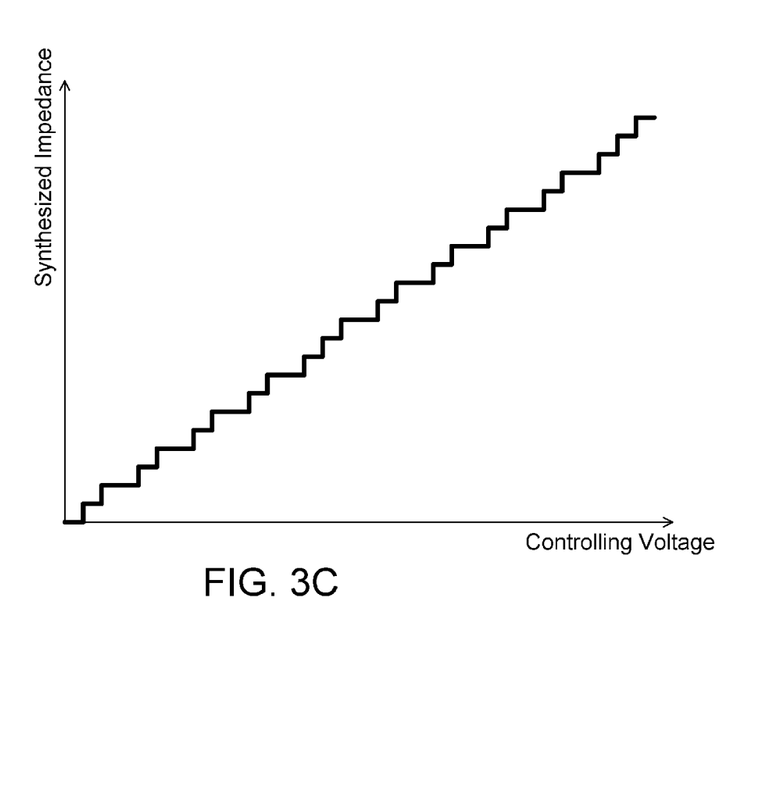
FIG. 3C shows the relationship between the input and output of the Digital Impedance Synthesizer DZS as an embodiment of the present invention.

FIG. 3C shows the relationship between the input and output of the Digital Impedance Synthesizer DZS as an embodiment of the present invention. It is stepwise linear as well as monotonic.

Assume that the above conditions for linearity are met for what are shown in FIG. 3A, and each individual of the switches in all the Impedance Modules ZMs can be turned on-and-off by any suitable control means. In the Impedance Module $ZM_2$, when $S_{21}$ is closed, all the Impedance Elements ZEs are short-circuited and hence impedance between the output terminals $T_{o21}$ and $T_{o22}$ is zero; When $S_{21}$ is open and $S_{22}$ is closed, the impedance between the output terminals $T_{o21}$ and $T_{o22}$ is equal to $Z_2$; When both $S_{21}$ and $S_{22}$ are open and $S_{23}$ is closed, the impedance between the output terminals $T_{o21}$ and $T_{o22}$ is equal to $2\times Z_2$; When switches $S_{21}$, $S_{22}$ and $S_{23}$ are open and $S_{24}$ is closed, the impedance between the output terminals $T_{o21}$ and $T_{o22}$ is equal to $3\times Z_2$; When all four switches are open, the impedance between the output terminals $T_{o21}$ and $T_{o22}$ is equal to $4\times Z_2$.

Hence by turning on the appropriate one of the four switches in the Impedance Module $ZM_2$, i.e. $S_{2i}$ in $ZM_2$, for $i=1$ to 4, the output of the Impedance Module $ZM_2$, i.e. $Z_{2o}$, can be varied monotonically from 0 to $4\times Z_2$ in equal steps of $Z_2$. In general for any Impedance Module ZM, by turning on the appropriate ones of the switches in the Impedance Module ZM, i.e. $S_{mi}$ in $ZM_m$, for $i=1$ to $N_m$, the output of the Impedance Module $ZM_m$, i.e. $Z_{mo}$, can be varied monotonically from 0 to $Z_m N_m$ in equal steps of $Z_m$. Note that when $S_{2i}$ is shorted, the status of $S_{2(i+j)}$ is immaterial for $j=1$ to $N_m-i$.

It is also obvious that for all the Impedance Modules ZMs, by turning on the appropriate switches in each of the Impedance Modules ZMs, the overall impedance of the Digital Impedance Synthesizer $Z_{DZS}$ can be varied monotonically from 0 to $\Sigma Z_m \times N_m$ for $m=1$ to $M_{ZM}$, in equal steps of $Z_1$, and in a total of $\Pi(N_m+1)$ steps, for $m=1$ to $M_{ZM}$.

In general when the impedance of Impedance Element ZE is of a complex value, i.e. $Z_m=A_m+jB_m$, A being the resistive component and B being the reactive component, for $m=1$ to $M_{ZM}$, the largest impedance value achievable from the Impedance Module $ZM_m$ is the direct arithmetic sum of impedances from all the Impedance Elements ZEs within the Impedance Module $ZM_m$, i.e. $Z_m\times N_m=A_m\times N_m+jB_m\times N_m$. For all the Impedance Modules ZMs, by turning on the appropriate switches in each of the Impedance Modules ZMs, the overall impedance synthesized by the Voltage Controlled Impedance Synthesizer $Z_{VCZS}$ can be varied monotonically from $0+j0$ to $\Sigma Z_m \times N_m$, i.e. from $0+j0$ to $\Sigma(A_m+jB_m)\times N$ for $m=1$ to $M_{ZM}$, in equal steps of $Z_1$, and in a total of $\Pi(N_m+1)$ steps, for $m=1$ to $M_{ZM}$.

In practice, due to various reasons, such as the tolerance in the electrical parameters of the Impedance Elements ZEs, the non-linearity of the Impedance Element ZEs, and the contact impedance of the switches that might be considered attributed to the Impedance Elements connected to, etc., there is likely some deviation in the actual impedance value of $Z_{mc}$ from the nominal impedance value of the Impedance Elements.

Designating this deviation by $\delta Z_{mc}$, and assuming $\delta Z_a$ is the largest deviation for any of ALL Impedance Elements ZEs in ALL Impedance Modules ZMs, i.e. the largest among all $\delta Z_{mc}$, $c=1$ to $N_m$, $m=1$ to $M_{ZM}$, the maximum deviation of $Z_{mo}$, the maximum impedance of the $m^{th}$ Impedance Module ZM from its nominal value is $\delta Z_{mo}$, then $\delta Z_{mo}=\delta Z_a\times N_m$.

Therefore, in comparison to the nominal impedance values, the deviation of $Z_{VCZS}$, the output of the Voltage Controlled Impedance Synthesizer VCZS, is $\delta Z_{VCZS}$, and the maximum value of $\delta Z_{VCZS}=\Sigma \delta Z_{mo}$ is:

$$\delta Z_{VCZS}=\Sigma \delta Z_{mo}=\Sigma \delta Z_a \times N_m=\delta Z_a \times \Sigma N_m \text{ where } m=1 \text{ to } M_{ZM}.$$

If the steps are controlled such that each time one and only one Impedance Element ZE in any of the Impedance Modules ZMs is added to or removed from contributing to the output of the Impedance Module ZM, the maximum change in the impedance deviation from the nominal, at each step change of the Impedance Module, would be $\delta Z_a$, and total change in the impedance deviation from the nominal impedance $Z_{VCZS}$ for the Voltage Controlled Impedance Synthesizer VCZS, is $\delta Z_{VCZS}=|\delta Z_a|\times M_{ZM}$ In order to make sure that the impedance change under control is monotonic, it is required that $$|\delta Z_{VCZS}|<Z_1 \text{ i.e. } |\delta Z_a|\times M_{ZM}<Z_1, \text{ i.e. } |\delta Z_a|<Z_1/M_{ZM}$$

In other words, the deviation of impedance of any of the Impedance Elements ZEs would need to be less than the nominal impedance value of the smallest (least significant) Impedance Element ZE divided by the total number of Impedance Modules ZMs, $M_{ZM}$.

Hence to achieve linearity relationship between the synthesized impedance of a Digital Impedance Synthesizer DZS and the controlling digital input in practice the values of the Impedance Elements in each of all the Impedance Modules need to be substantially close to the theoretical values required as necessary conditions for linearity, such that the ratios of the impedance values of each one Impedance Element ZE between the Impedance Modules ZMs would need to be bounded by the following equation:

$Z_1:Z_m=1: [\Pi(N_i+1)]\pm|\delta Z_a|/Z_1=1:$
$[\Pi(N_i+1)]\pm 1/M_{ZM \text{ where } i}=1$ to m-1, for m=1 to $M_{ZM}$.

Shown in FIG. 3A there is also the Switch Pattern Encoder SPE, implemented in digital processing means, to control the Impedance Modules ZMs by providing digital control signals $CS_S$ to the Impedance Modules ZMs according to Zvczs_d(t), the impedance value in digital form, prescribed to be synthesized by the Voltage Controlled Impedance Synthesizer VCZS. Any change in the value of Zvczs_d(t) results in change in the digital control signals $CS_S$ to the Impedance Modules ZMs to change accordingly the overall on/off state of the all switches of all the Impedance Modules ZMs in the Voltage Controlled Impedance Synthesizer VCZS so that an impedance value of $Z_{VCZS}$ is synthesized in the same value as represented by Zvczs_d(t).

Referring back to FIG. 1 for the block diagram on the operation principle of a Voltage Controlled Impedance Synthesizer VCZS. There is the special case when the output of the ADC could be deployed to control the Digital Impedance Synthesizer DZS directly, such as the case when the intended impedance is directly proportional to the controlling voltage Vcon(t), i.e. in the case when simply Vcont_d(t)=K.Zvczs_d(t), K being a constant, and that the digital pattern of the ADC output already coded in a form meeting the requirement of the Digital Impedance Synthesizer DZS, i.e. in the case Zvczs_d(t)=Zvczs_s(t). The block diagram of FIG. 1 can thus be simplified to that of FIG. 4, i.e. the Digital Function Generator DFG and Switch Pattern Encoder SPE are no longer required and are thus removed from the block diagram as shown, as an embodiment of the present invention with simplified structure.

Figure 4:
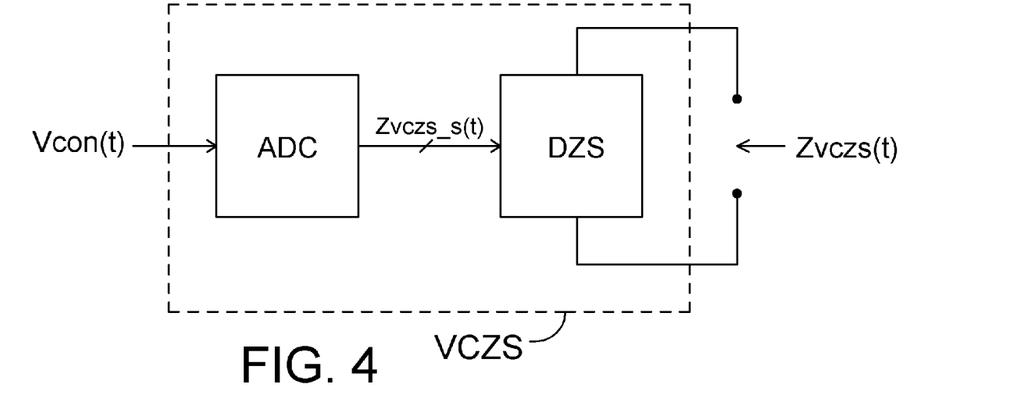
FIG. 4 shows the simplified structure of Voltage Controlled Impedance Synthesizer in an exemplary embodiment of the invention, whereby the impedance is directly proportional to the controlling voltage.
Figure 5:
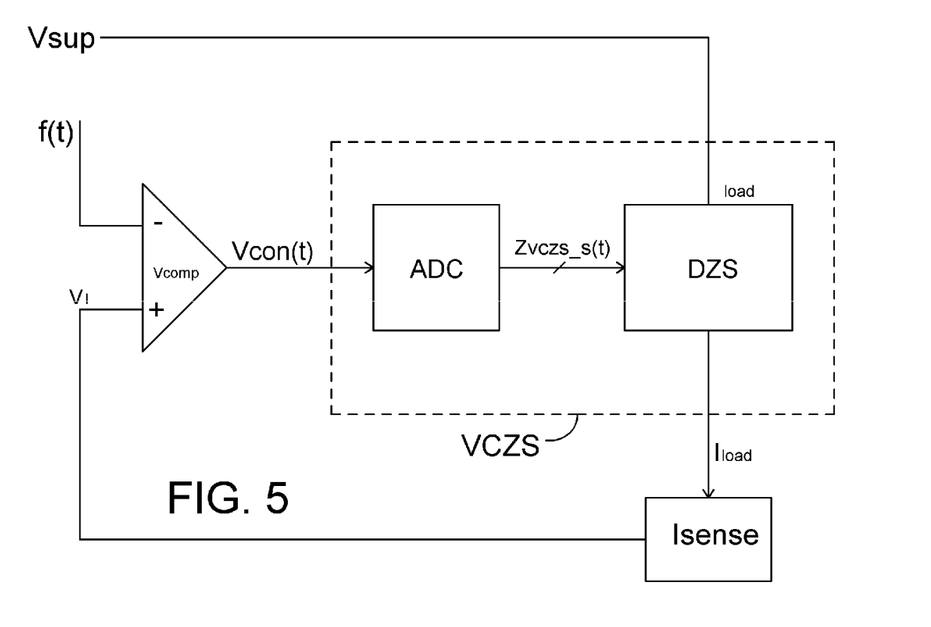
FIG. 5 shows the principle of operation in controlling the current through a Voltage Controlled Impedance Synthesizer as an exemplary embodiment of the invention.

FIG. 5 shows how current is controlled by the Voltage Controlled Impedance Synthesizer VCZS in an exemplary embodiment of the invention. As shown, the power supply $V_{sup}$ is driving the Voltage Controlled Impedance Synthesizer VCZS as the load, with a current $I_{load}$. With a simplified structure of the Voltage Controlled Impedance Synthesizer VCZS as shown in FIG. 4, $I_{load}$ is measured by Isense to give a representative voltage $V_I$ which is compared to a prescribed voltage function f(t) to generate a voltage difference Vcon(t), which is in essence an error signal representative of the deviation of the measured current from the reference function f(t). Vcon(t) controls the Voltage Controlled Impedance Synthesizer VCZS in a direction to reduce the magnitude of Vcon(t) by the action of negative feedback control. When the magnitude of Vcon(t) is sufficiently small, the following is approximately true:

$f(t)=V_I=K1\cdot I_{load \text{ where }} K1$ is a constant, then $I_{load}=f(t)/K1,$ i.e., the load current $I_{load}$ tracks proportionally to the function f(t), irrespective of any variations of the supply voltage of and change of the load impedance.

A typical and useful case is that f(t) is a constant voltage, $f(t)=K2=K1\cdot I_{load}$, therefore $I_{load}=f(t)/K1=K2/K1$, which is also a constant, i.e. the load current is controlled constant despite of any variations of the supply voltage of and change of the load impedance.

Figure 6:
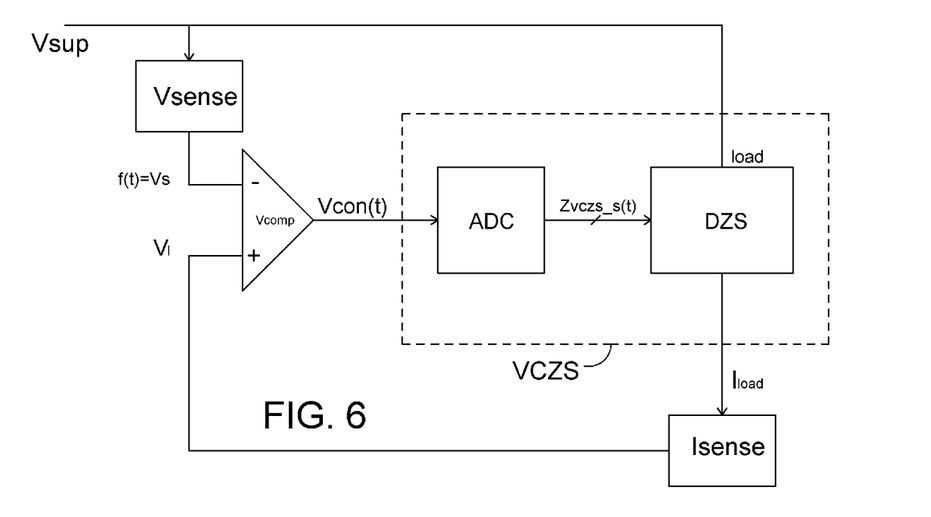
FIG. 6 shows the principle of operation in linearizing the impedance as synthesized from the Voltage Controlled Impedance Synthesizer as an exemplary embodiment of the invention.

If, instead of f(t), $V_I$ is compared to the voltage $V_S$ of the supply voltage $V_{sup}$, $V_S$ being sensed and scaled appropriately by the voltage sensor Vsense, as shown in FIG. 6, the current through the impedance synthesized can be controlled to follow the supply voltage $V_{sup}$. As shown, $I_{load}$ is measured by Isense to give a representative voltage $V_I$ which is compared to Vs to generate a voltage difference Vcon(t), which is in essence an error signal representative of the deviation of the impedance synthesized from a nominal. Vcon(t) controls the Voltage Controlled Impedance Synthesizer VCZS in a direction to reduce the magnitude of Vcon(t) by the action of negative feedback control. When the magnitude of Vcon(t) is sufficiently small, the following is approximately true:

$f(t)=V_S=K2\cdot V_{sup}=V_I=K1\cdot I_{load}$, leading to $V_{sup}/I_{load}=K1/K2=Z_{VCZS}$ i.e., the impedance as the output of the Voltage Controlled Impedance Synthesizer VCZS is controlled to remain constant, and also linear, even if the individual composing elements, such as the LEDs for example, of the impedance synthesizer are not linear.

Figure 7:
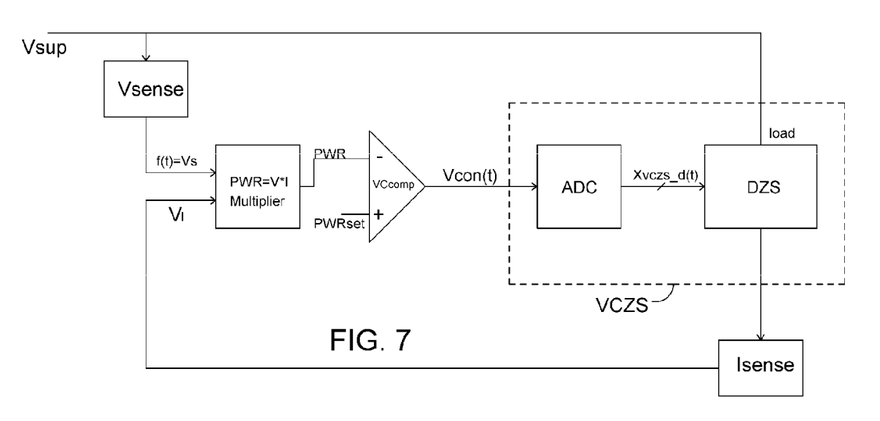
FIG. 7 shows the principle of power control through the Voltage Controlled Impedance Synthesizer as an exemplary embodiment of the invention.

Further, as yet another exemplary embodiment of the invention, power can also be controlled constant by the Voltage Controlled Impedance Synthesizer VCZS, as illustrated in FIG. 7. As shown, the power of the load is represented by PWR, the product of $V_S$ and $V_I$, which is compared to a prescribed constant power PWRset. $V_{sup}$ is sensed and scaled down to $V_s$ by the voltage sensor Vsense, and $V_I$ is a voltage representation of the load current $I_{load}$ as measured by the current sensor Isense. The result of comparison, Vcon(t), which is in essence an error signal representative of the deviation of the measured power from the reference, drives the Voltage Controlled Impedance Synthesizer VCZS in the direction to minimize the value of Vcon(t), leading to the following:

$f(t)=V_s=K2\cdot V_{sup}$ $V_I=K1\cdot I_{load}$

Hence, $PWR=V_s\cdot V_I=K2\cdot V_{sup}\cdot K1\cdot I_{load}$

When Vcon(t) is sufficiently small by the action of negative feedback control, i.e.

$Vcon(t)=PWRset-PWR=0$ $PWRset=PWR=K2\cdot V_{sup}\cdot K1\cdot I_{load}$

Therefore the power supplied to the load $Z_{VCZS}$ is $V_{sup}\cdot I_{load}=PWRset/(K1\cdot K2)$ which is a constant as long as PWRset remains constant.

Hence, the power of the load $Z_{VCZS}$ is maintained constant despite of any variations of the supply voltage $V_{sup}$ or the load impedance $Z_{VCZS}$.

Figure 8:
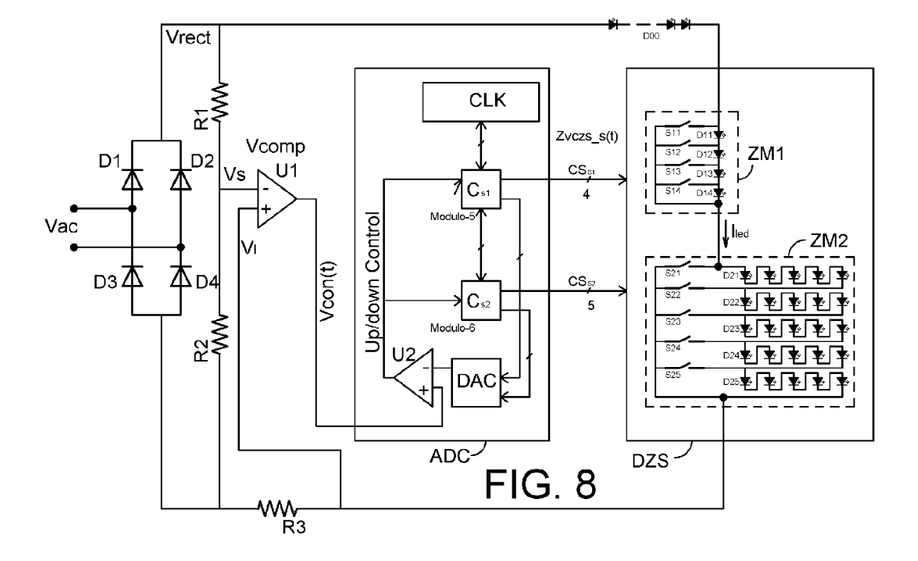
FIG. 8 shows the principle of an LED driver whereby the combined impedance of a series of LEDs is linearized by the Voltage Controlled Impedance Synthesizer as an exemplary embodiment of the invention.

As another practical example of application of the Voltage Controlled Impedance Synthesizer VCZS as an exemplary embodiment of the invention, a light-emitting device directly powered from an AC power supply is illustrated in FIG. 8.

As shown, the LED diodes are connected in series as basic Impedance Elements ZEs. There are two Impedance Modules ZMs, $ZM_1$ and $ZM_2$. $ZM_1$ is comprising four LEDs D11, D12, D13 and D14. $ZM_2$ is comprising five LED strings D21, D22, D23, D24 and D25, each string comprising five LEDs. D00, a string of one or more LEDs, is connected in series with the Voltage Controlled Impedance Synthesizer VCZS so as to provide a non-zero impedance value of the light-emitting device at the "zero impedance" state of the Voltage Controlled Impedance Synthesizer VCZS, and to add to the total impedance value of the light-emitting device at any digital state of the synthesizer. The series of LEDs D00, in series with the LEDs in the Voltage Controlled Impedance Synthesizer VCZS, provide the lighting output from the light-emitting device. By design D00 can balance out excessive DC voltage as rectified from the supply $V_{ac}$ by the bridge rectifier formed of the rectifier diodes D1, D2, D3 and D4, which effectively extends the supply input voltage range of $V_{ac}$ so that the current through the light-emitting device is limited to a prescribed safe value within the control range of the Voltage Controlled Impedance Synthesizer VCZS. However, due to the non-linearity characteristics of the LED diodes, D00 will also extend the non-conducting portion of the mains cycle, hence reducing the effectiveness of the LED device as a whole. As a modified version of the embodiment, the series of LEDs D00 can be replaced by a current limiting device for over current protection, but without contributing to the luminous output of the light emitting device.

Assuming all the LEDs bear the same impedance value at any particular current, the ratio of the values of impedance elements between $ZM_1$ and $ZM_2$ is 1 to 5. Therefore there are as shown five LED diodes in each segment of the Impedance Module $ZM_2$ while only one in $ZM_1$. The Impedance Module $ZM_1$ comprises four switches S11, S12, S13 and S14 which are controlled by a Modulo-5 (Quinary) up-down counter $Cs_1$ in the ADC. Likewise, the Impedance Module $ZM_2$ comprises five switches S21, S22, S23, S24 and S25 which are controlled by a Modulo-6 (Senary) up-down counter $C_{S2}$ in the ADC.

Not explicitly shown in the diagram, the output of the counter $C_{s1}$ is already encoded to provide one single digit active for one counting state, so that S11 only is turned on at count state 0, S12 only is on at counter state 1, S13 only is on at counter state 2, S14 only is on at counter state 3, and no switch is on at counter state 4. This can be easily achieved by a binary-to-decimal encoder for example, working with a binary counter.

As shown, when S11 is closed, all the LEDs in $ZM_1$ are short-circuited. When S12 is closed, all except D11 are short-circuited. When S13 is closed, only D11 and D12 are not short-circuited. When S14 is closed, only D14 is short-circuited. When all circuits are open, all four LEDs are not short-circuited. Hence the impedance of the Impedance Module $ZM_1$ can be controlled by the four switches to step through five different values, i.e. 0, $Z_1$, $2Z_1$, $3Z_1$ and $4Z_1$ where $Z_1$ is the impedance value of a single LED. Similarly the impedance of the Impedance Module $ZM_2$ can be controlled by the five corresponding switches driven by the counter $C_{S2}$ to step through six different values, i.e. 0, $5Z_1$, $10Z_1$, $15Z_1$, 20Z1 and $25Z_1$.

The various states of the switches and the corresponding impedance values synthesized in multiples of a single LED are listed out in the following table:

| State of Counters | | Impedance $Z_{VCZS}$ | |
|---|---|---|---|
| $C_{S2}$ Senary | $C_{S1}$ Quinary | Switch States Decimal | in $Z_1$ = single LED Impedance |
| 0 | 0 | 0 | 0 |
| 0 | 1 | 1 | 1 |
| 0 | 2 | 2 | 2 |
| 0 | 3 | 3 | 3 |
| 0 | 4 | 4 | 4 |

-continued

| State of Counters | | Impedance $Z_{VCZS}$ | |
|---|---|---|---|
| $C_{S2}$ Senary | $C_{S1}$ Quinary | Switch States Decimal | in $Z_1$ = single LED Impedance |
| 1 | 0 | 5 | 5 |
| 1 | 1 | 6 | 6 |
| 1 | 2 | 7 | 7 |
| 1 | 3 | 8 | 8 |
| 1 | 4 | 9 | 9 |
| 2 | 0 | 10 | 10 |
| 2 | 1 | 11 | 11 |
| 2 | 2 | 12 | 12 |
| 2 | 3 | 13 | 13 |
| 2 | 4 | 14 | 14 |
| 3 | 0 | 15 | 15 |
| 3 | 1 | 16 | 16 |
| 3 | 2 | 17 | 17 |
| 3 | 3 | 18 | 18 |
| 3 | 4 | 19 | 19 |
| 4 | 0 | 20 | 20 |
| 4 | 1 | 21 | 21 |
| 4 | 2 | 22 | 22 |
| 4 | 3 | 23 | 23 |
| 4 | 4 | 24 | 24 |
| 5 | 0 | 25 | 25 |
| 5 | 1 | 26 | 26 |
| 5 | 2 | 27 | 27 |
| 5 | 3 | 28 | 28 |
| 5 | 4 | 29 | 29 |

Therefore, as shown by the table, by controlling the switch states of the two Impedance Modules $ZM_1$ and $ZM_2$ for a total of 30 states, the impedance of the Voltage Controlled Impedance Synthesizer VCZS, i.e. $Z_{VCZS}$, is stepped from 0 to 29 in steps of one, each step being equivalent to the impedance of one single LED.

As shown in FIG. 8, current $I_{led}$ passing through the light-emitting device, i.e. the Voltage Controlled Impedance Synthesizer VCZS, is measured as $V_I$, voltage drop on R3, as signal representative of the magnitude of the current of the light-emitting device. By voltage comparator U1, $V_I$ is compared to $V_s$, voltage scaled down by voltage divider formed by R1 and R2, and signal representative of the rectified AC voltage $V_{rect}$. If $V_I$ is larger than $V_s$, meaning LED current $I_{led}$ is excessive, the result of comparison. Vcon(t), will go high which drives the ADC output up and hence the impedance of the Voltage Controlled Impedance Synthesizer, i.e. the total impedance of the LEDs in the series, up. Consequently, the LED current $I_{led}$ is reduced to a value such that $V_I$ is close to $V_s$. Similarly in the opposite direction, any excessive drop of LED current will result in a decrease in the total impedance of the LEDs in the series by the action of feedback control. In other words, the LED current follows the voltage in proportion, meaning that the load impedance of the whole LED series remains constant in time, and linear with respect to the changing supply voltage and current, despite of the non-linear characteristics of the individual LEDs.

Note the analog-to-digital converter ADC deployed for the present embodiment is an ordinary tracking ADC with two up/down counters $C_{s1}$ and $C_{s2}$, of Modulo-5 and Modulo-6 respectively. In general, any ADC will do the job provided the digital output, encoded as necessary, matches the design of the Digital Impedance Synthesizer DZS as described.

Apart from the availability of many different sorts of ADCs that can be chosen for deployment, note also that there is much more room for design variation of the Voltage Controlled Impedance Synthesizer VCZS as different embodiments of the invention. By selecting the number of Impedance Modules ZMs and the number of Impedance Elements ZEs in each Impedance Module ZM, there is infinite number of variations of the Voltage Controlled Impedance Synthesizer VCZS. A best embodiment of the invention can therefore be chosen to suit individual design targets, such as those for optimizing control accuracy, control range, number of switches, switch driving and controlling circuit topology, parts availability, system stability, total implementation cost, etc. The vast number of variations available by the invention provides much design flexibility in choosing the best approach for any application intended.

Figure 9:
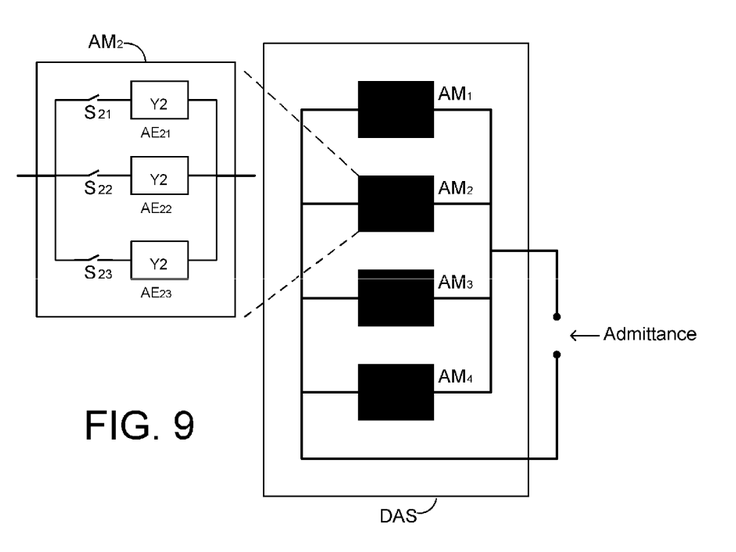
FIG. 9 shows the operation principle of a Digital Admittance Synthesizer DAS as an embodiment of the present invention.

Further, by duality property of electrical circuits, all circuit principles described for impedance synthesis in this application can also be applied to admittance synthesis. As an exemplary embodiment of present invention the basic architecture of a Digital Admittance Synthesizer DAS is shown in FIG. 9. The Digital Admittance Synthesizer DAS contains four two-terminal Admittance Modules $AM_1$, $AM_2$, $AM_3$ and $AM_4$ which are connected in parallel, in contrary to the Digital Impedance Synthesize whereby the Impedance Modules ZMs are connected in series. For the purpose of illustration, the second Admittance Module $AM_2$ is shown as an example with the details. The Admittance Module $AM_2$ contains three two-terminal Admittance Elements $AE_{21}$, $AE_{22}$ and $AE_{23}$ which are connected together at one terminal. By action of the switches $S_{21}$, $S_{22}$ and $S_{23}$, the Admittance Module $AM_2$ can be controlled to deliver Admittance values 0, $Y_2$, $2Y_2$ and $3Y_2$, $Y_2$ being the admittance value of each of the Admittance Elements AEs of the Admittance Module $AM_2$. Following the same principle as the Digital Impedance Synthesizer and with voltage-current duality in mind, it can be deduced that a high-efficiency Digital Admittance Synthesizer capable of providing monotonic and stepwise variable admittance values can be achieved. Furthermore, through a similar arrangement as shown in FIG. 1, with the Digital Impedance Synthesizer DZS replaced by a Digital Admittance Synthesizer DAS, a Voltage Controlled Admittance Synthesizer VCAS can be accordingly constructed.

Although the invention and its advantages have been described in detail, it should be understood that various changes, substitutions, and alterations can be made therein without departing from the spirit and scope of the invention as described. That is, the discussion included in this application is intended to serve as a basic description. It should be understood that the specific discussion may not explicitly describe all embodiments possible; as many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the invention.

The invention claimed is:

1. An impedance synthesizer, comprising:
   one or more two-terminal impedance modules connected in series;
   each impedance module having one or more two-terminal impedance elements connected in series; impedance values of the one or more two-terminal impedance elements in each impedance module being equal; wherein the impedance values bear ratios $Z_1:Z_2:Z_3: \ldots Z_m: \ldots$ in order of increasing value, $Z_1:Z_m=1:\Pi(N_i+1)$ where i=1 to m−1, $Z_m$ is the impedance value of each impedance element of a $m^{th}$ impedance module, $N_i$ is the total number of the impedance elements in an $i^{th}$ impedance module, and $\Pi$ is a mathematical multiplication operator;
   a number of controllable switches associated with said impedance elements of each impedance module; and
   a control means to control the controllable switches to short out a selected number of the impedance elements.

2. The impedance synthesizer of claim 1, wherein the impedance elements in all the impedance modules are of equal quality factor.

3. The impedance synthesizer of claim 1, wherein the control means comprises an analog-to-digital converter with an input and an output, said input being coupled to receive an analog input signal and said output being coupled to drive the controllable switches.

4. The impedance synthesizer of claim 3, further comprising a digital function generator with a first input, a second input and an output, wherein: the first input is coupled to the output of the analog-to-digital converter; the second input is coupled to receive a digital control signal; the output is coupled to drive the controllable switches; whereby said output is a digital signal representative of a function generated according to the analog input signal and the digital control signal.

5. The impedance synthesizer of claim 4, further comprising a switch pattern encoder with an encoder input and an encoder output, wherein the encoder input is coupled to the output of the digital function generator and the encoder output is coupled to drive the controllable switches.

6. A method of impedance synthesis, comprising steps of:
   connecting one or more two-terminal impedance modules in series;
   connecting one or more two-terminal impedance elements of equal impedance value in series in each impedance module; wherein the impedance values bear ratios $Z_1:Z_2:Z_3: \ldots Z_m: \ldots$ in order of increasing value, $Z_1:Z_m=1:\Pi(N_i+1)$ where i=1 to m−1, $Z_m$ is the impedance value of each impedance element of a $m^{th}$ impedance module, $N_i$ is the total number of the impedance elements in an $i^{th}$ impedance module, and $\Pi$ is a mathematical multiplication operator;
   controlling a number of controllable switches associated with said impedance elements to short out a selected number of the impedance elements.

7. The method of claim 6, further comprising converting an analog input signal to a digital switch control signal to control the controllable switches; whereby the value of the synthesized impedance is controlled by the analog signal.

8. The method of claim 6, further comprising converting an analog input signal to a first digital signal; converting the first digital signal according to a second digital signal to form the digital switch control signal to control the controllable switches; whereby the value of the synthesized impedance is controlled by the analog signal.

9. The method of claim 8, further comprising encoding the digital switch control signal to control the controllable switches.

* * * * *